United States Patent
Leslie

(10) Patent No.: US 11,514,961 B2
(45) Date of Patent: Nov. 29, 2022

(54) MEMORY TOPOLOGIES

(71) Applicant: Micron Technology, Inc., Boise, ID (US)

(72) Inventor: Matthew B. Leslie, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/466,961

(22) Filed: Sep. 3, 2021

(65) Prior Publication Data

US 2022/0076721 A1 Mar. 10, 2022

Related U.S. Application Data

(60) Provisional application No. 63/075,049, filed on Sep. 4, 2020.

(51) Int. Cl.
| | |
|---|---|
| *G11C 5/06* | (2006.01) |
| *G11C 8/18* | (2006.01) |
| *G06F 15/173* | (2006.01) |
| *G11C 7/10* | (2006.01) |
| *G11C 8/06* | (2006.01) |

(52) U.S. Cl.
CPC ............. *G11C 8/18* (2013.01); *G06F 15/173* (2013.01); *G11C 5/06* (2013.01); *G11C 7/1039* (2013.01); *G11C 8/06* (2013.01)

(58) Field of Classification Search
CPC ........... G11C 5/06; G11C 7/1039; G11C 8/06; G11C 8/18; G06F 15/173

USPC ................................................. 365/63, 233.1
See application file for complete search history.

(56) References Cited

U.S. PATENT DOCUMENTS

| | | | | |
|---|---|---|---|---|
| 6,970,369 | B2 * | 11/2005 | Funaba ............... | G11C 11/4093 365/233.17 |
| 7,113,418 | B2 * | 9/2006 | Oberlin .................. | H05K 1/181 365/51 |
| 7,339,840 | B2 * | 3/2008 | Wallner ................. | G11C 5/063 365/198 |
| 7,821,803 | B2 * | 10/2010 | Kim ......................... | G11C 5/04 365/100 |
| 8,054,664 | B2 | 11/2011 | Harashima et al. | |
| 8,750,010 | B2 | 1/2014 | Hofstra | |
| 8,935,505 | B2 | 1/2015 | Larson | |
| 10,381,067 | B2 * | 8/2019 | Shaeffer ................. | G06F 13/16 |

\* cited by examiner

*Primary Examiner* — Son L Mai
(74) *Attorney, Agent, or Firm* — Brooks, Cameron & Huebsch, PLLC

(57) ABSTRACT

The present disclosure includes apparatuses and methods related to memory topologies. An apparatus may include a first plurality of clam-shell paired memory devices arranged in a star connection topology, each clam-shelled pair of the first plurality of memory devices being coupled by a respective matched branch to a first common command address signal trace. The apparatus may include a second plurality of memory devices coupled to a second common command address signal trace.

20 Claims, 5 Drawing Sheets

MEMORY TOPOLOGIES

PRIORITY INFORMATION

This application claims the benefit of U.S. Provisional Application No. 63/075,049, filed Sep. 4, 2020, the contents of which are included herein by reference.

TECHNICAL FIELD

The present disclosure relates generally to memory devices, and more particularly, to apparatuses having memory device topologies and methods of configuring these memory device topologies.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile memory, such as DRAM, for example, and/or non-volatile memory, such as Flash memory or RRAM, for example. The DIMMs can be utilized as a main memory in computing systems.

DETAILED DESCRIPTION

Figure 1A:
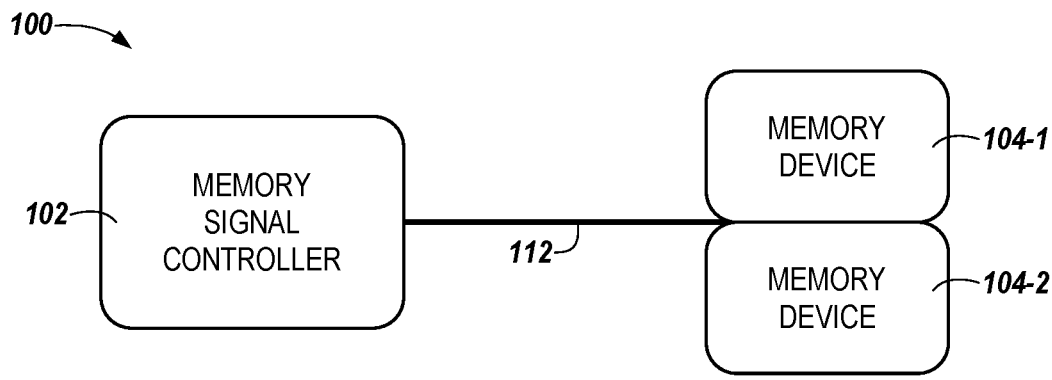
FIGS. 1A-1E are block diagrams of apparatuses 100 including clam-shell paired memory devices arranged in various connection topologies in accordance with a number of embodiments of the present disclosure.

DIMMs may include a plurality of memory devices (e.g., chips, dies, etc.). For example, a DIMM may include mounted and/or integrated sets of DRAM memory devices. Data on the memory devices may be accessed and/or manipulated based on command/address signals. For example, a command/address signal may be generated by a host, a central processing unit (CPU), a memory controller, etc. Generating the command/address (CA) signal may include driving the command/address signal to a register clock driver (RCD).

An RCD may make copies of the command/address signal and/or redrive the command/address signal to a portion of the plurality of memory devices mounted to and/or integrated with the DIMM. In some examples, a single RCD may be assigned to drive a command/address signal to a single memory device. Such an arrangement may produce a relatively best signal integrity between the RCD and its corresponding memory device. However, in such an arrangement every memory device of the DIMM may need its own command/address signal. Routing the resulting large amount of connections for delivering the individual command/address signals between the respective RCDs and their corresponding memory device may limit the amount of memory devices that will fit on a DIMM and/or may not be possible given the size constraints and/or number of memory devices on some DIMMs.

Alternatively, a single RCD may make copies of the command/address signal and/or redrive the command/address signal to a plurality of memory devices mounted to and/or integrated with the DIMM. For example, a plurality of memory devices of the DIMM may be wired together in a sequence to a single RCD. For example, a plurality of memory cells may be daisy chained together in a sequence stretching out in a chain arrangement from a single RCD. While such an arrangement may simplify routing between an RCD and the memory devices, it may significantly degrade command/address signal integrity. For example, a daisy chained configuration may lack symmetry in that some of the memory devices may be relatively closer to the RCD while others are relatively further away from the RCD. As a result, as the command/address signal is propagated down the daisy chain of memory devices it may hit a portion of the trace that splits off to a closet memory device and create a signal reflection that degrades the integrity of the command/address signal. Some of the signal would pass the split and continue on down the trace to a next split off to a next closest memory device and so on. For example, each time the command/address signal passes a split in the trace the command/address signal may be altered and its data signal eye may be changed (e.g., degraded). Setting aside the degraded signal integrity, operating a plurality of memory devices on a single command/address net may not, as a result of material and/or signal transmission physics, be able to support highspeed memory access demands of modern devices.

In contrast, the present disclosure includes apparatuses and methods related to memory device topologies which provides high speed memory access while preserving command/address signal integrity with a routing complexity repeatable and achievable on DIMM memory chips. An example apparatus can include a first number of clam-shell paired memory devices arranged in a star connection topology, each clam-shelled pair of the first number of memory devices being coupled by a respective matched branch to a first common command/address signal trace; and a second number of memory devices coupled to a second common command/address signal trace.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIGS. 1A-1D are block diagrams of apparatuses including clam-shell paired memory devices arranged in various star topologies in accordance with a number of embodiments of the present disclosure. The described components, configurations, and/or operation of the apparatuses described with respect to FIGS. 1A-1D may include and/or be interchanged with the described components, configurations, and/or operations in relation to any other of the FIGS. 1A-1D, FIG. 2, FIG. 3, FIG. 4, and/or FIG. 5.

FIG. 1A is a block diagram of an apparatus 100. As used herein, an "apparatus" can refer to, but is not limited to, any of a variety of structures or combinations of structures, such as a circuit or circuitry, a die or dice, a module or modules, a device or devices, or a system or systems, for example. The apparatus 100 may include a memory module. A memory module may include a printed circuit board that includes mounted or integrated memory devices (e.g., chips). For example, the apparatus 100 may be a portion of a dual in-line memory module (DIMM). For example, the apparatus 100 may include a DIMM communicatively coupled to a host, a host controller, a central processing unit (CPU), a memory controller, etc. For example, the apparatus 100 may include a DIMM installed in a memory slot of a motherboard of a host computing device and/or installed in a peripheral device communicatively couple to a host computing device.

The apparatus 100 may include a plurality of memory devices 104-1 . . . 104-2 (e.g., DRAM chips) mounted on and/or integrated with the apparatus 100. A memory device 104-1 . . . 104-2 (referred to collectively as memory devices 104) may include a memory for storing data accessible by a host, a host controller, a central processing unit (CPU), a memory controller, etc. For example, a memory device 104 may include volatile memory, such as DRAM, and/or non-volatile memory, such as storage class memory and/or three-dimensional (3D) cross-point (X-point) memory, among other types of memory.

As described above, the data stored on memory devices 104 may be accessible to a host, a host controller, a central processing unit (CPU), a memory controller, etc. For example, a host computing device, a host controller, a central processing unit (CPU), a memory controller, etc. may read, write, erase, etc. bits of data from the memory devices 104. In some examples, a host, a host controller, a central processing unit (CPU), a memory controller, etc. may send a command/address signal to the apparatus 100 specifying and/or effectuating the access of the bits of data from the memory devices 104.

In some examples, the apparatus 100 may include a memory signal controller 102. In some examples, the memory signal controller 102 may include a register clock driver (RCD). An RCD can be a hardware register that buffers control signals to the apparatus 100. While an RCD may add a clock cycle to the operation of the apparatus 100 and utilize more power than accessing memory devices 104-1 . . . 104-2 directly by a host, a host controller, a central processing unit (CPU), a memory controller, etc., the RCD may accommodate heavier electrical loads placed on high-speed and/or high-density memory modules.

A command/address signal sent from a host, a host controller, a central processing unit (CPU), a memory controller, etc. may be received by an RCD. The RCD may copy and/or redrive the received command/address signal to the corresponding memory devices 104-1 . . . 104-2. For example, the RCD may receive a command/address signal across an input pin. The RCD may copy and/or drive the command/address signal to each memory device 104-1 . . . 104-2 across an output pin.

In some examples, the RCD may be a separate or independent component from a data buffer. For example, the memory signal controller 102 may be an RCD that is a separate component from a data buffer component of the apparatus 100. For example, command/address signals may come from the host, host controller, central processing unit (CPU), memory controller, etc. into a separate data buffer. The data from the data buffer may be fed into the RCD and the RCD may redrive the signals out to the memory devices 104-1 . . . 104-2. In such examples, the memory devices 104-1 . . . 104-2 receive the address and instructions whether a read or write operation is to be performed, but the data transferred in the operation is transferred between the data buffer and the memory devices 104-1 . . . 104-2. For example, if the command/address signal includes an instruction to perform a read operation on a particular memory device, the memory device may locate the data and push it out to the data buffer. The data buffer may redrive the data all the way back to a requesting CPU. In such examples, the RCD may handle driving command/address signals, whereas the data buffer may handle the resulting DQ reads and writes.

However, in some examples, the memory signal controller 102 may perform the operations associated with an RCD and the operations associated with the data buffer. For example, instead of having a separate RCD and data buffer, the memory signal controller 102 may be a data buffer that also assumes the functionality of an RCD. For example, a command/address signal may be sent from the host, host controller, central processing unit (CPU), memory controller, etc. to the memory signal controller 102. The memory signal controller 102 may create versions or copies of the command/address signal and may utilize a clock cycle to drive the versions or copies out to the memory device 104-1 . . . 104-2. Then the memory device 104-1 . . . 104-2 may, for example, read the data specified in the command/address signal and may push the data back to the memory signal controller 102, which may redrive the data back to the host, host controller, central processing unit (CPU), memory controller, etc. In such examples, the memory signal controller 102 may be referred to as a DIMM signal controller (DSC).

The memory signal controller 102 may be communicatively coupled to each memory device 104-1 . . . 104-2. For example, the memory signal controller 102 may be coupled to each of the memory devices 104-1 . . . 104-2 by a command/address signal trace 112. The command/address signal trace 112 may include a conductive path such as a physical wire that communicatively couples the memory signal controller 102 to each of the memory devices 104-1 . . . 104-2.

As described above, the apparatus 100 may include memory devices 104-1 . . . 104-2. In some examples, the memory devices 104-1 . . . 104-2 may include individual DRAM memory devices. The memory devices 104-1 . . . 104-2 may be arranged on the apparatus in claim-shelled pairs. A clam-shelled pair may include a pair of memory devices 104-1 . . . 104-2 that are located with one directly over the other. For example, where the apparatus 100 is a DIMM and the memory devices 104-1 . . . 104-2 are DRAM memory devices, a clam-shelled pair may include a first DRAM device mounted on top of the DIMM with a second DRAM device mounted directly underneath and within the shadow or form factor of the first DRAM device. For example, both memory devices 104-1 . . . 104-2 of a clam-shelled pair may be located in the same X/Y plane position of the apparatus 100, but they may be arranged along the Z plane such that one is directly over the other.

As a result, the memory device 104-1 . . . 104-2 loads on the command/address signal trace 112 may be positioned relatively close together. Accordingly, a common command/address signal trace 112 may be routed between the two clam-shell paired memory devices 104-1 . . . 104-2 and connect to a first via going up into a first memory device (e.g., 104-1) and a second via going down into a second memory device (e.g., 104-2, . . . , 104-2). This may accommodate high-speed signaling with relatively good signal integrity to the two memory devices 104-1 . . . 104-2.

The proximity of the memory devices 104-1 and 104-2 in the clam-shelled pair permits them to share access to a common signal trace 112. As such, a single command/address signal may be driven down the common signal trace 112 to both memory devices 104-1 and 104-2. As such, a single command/address signal generated and/or driven by the memory signal controller 102 may be utilized to access both memory devices 104-1 and 104-2 of a clam-shelled pair.

Figure 1B:
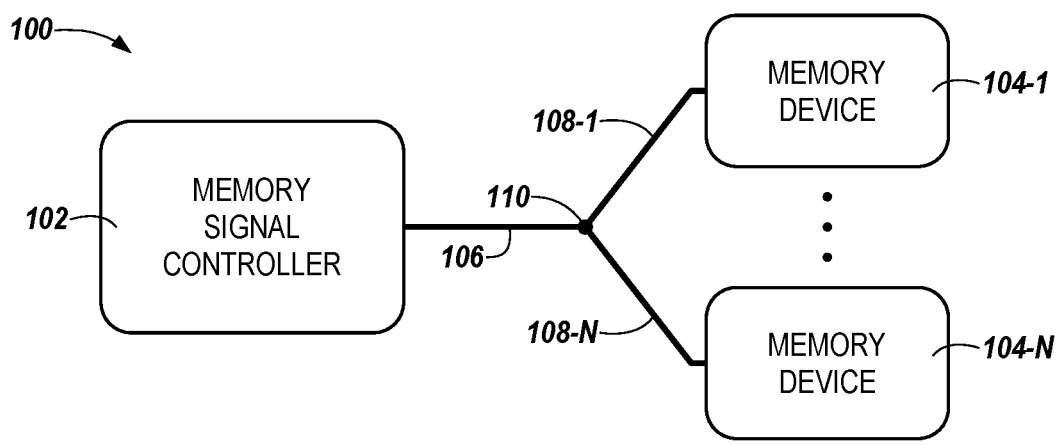

FIG. 1B illustrates a block diagram of the apparatus 100 including a memory signal controller 102 communicatively coupled to a plurality of memory devices 104-1 . . . 104-N via a command/address signal trace. FIG. 1B illustrates the apparatus 100 arranged in a star topology.

The star topology may refer to a memory signal controller 102 communicatively coupled to a plurality of memory devices 104-1 . . . 104-N via a command/address signal trace that is split between memory device 104-1 . . . 104-N loads. A star topology may include an arrangement where the memory signal controller 102 is communicatively coupled to a plurality of memory devices 104-1 . . . 104-N via a command/address signal trace including a trunk portion 106, a branch point 110, and/or a plurality of branch portions 108-1 . . . 108-N.

In some examples, each of the plurality of memory devices 104-1 . . . 104-N may be one of pair of memory devices arranged in a clam-shelled pair on the apparatus 100. For example, the memory device 104-1 may be one of a clam-shelled pair of memory devices.

However, star topologies may not necessarily require clam-shelled pairing of memory devices. For example, in some instances the plurality of memory devices 104-1 . . . 104-N may not be arranged as clam-shelled pairs on the apparatus 100, but may be arranged as individual spaced apart memory devices on the apparatus 100 such as at different X/Y plane positions. For example, the memory device 104-1 may not be clam-shell paired with another memory device, but may be a stand-alone memory device with respect to X/Y plane positioning on the apparatus 100.

In some examples, a trunk portion 106 may include a portion of the command/address signal trace that is coupled to an output pin of the memory signal controller 102 on one end and which splits at a branch point 110 opposite the end coupled to the output pin of the memory signal controller 102. The branch point 110 may include a portion of the command/address signal trace where the trunk portion 106 is split into the plurality of branch portions 108-1 . . . 108-N. Each branch portion 108-1 . . . 108-N may include a portion of the command/address signal trace that extends from the branch point 110 on one end to a respective memory device and/or clam-shell pair of memory devices on the other end.

Figure 1C:
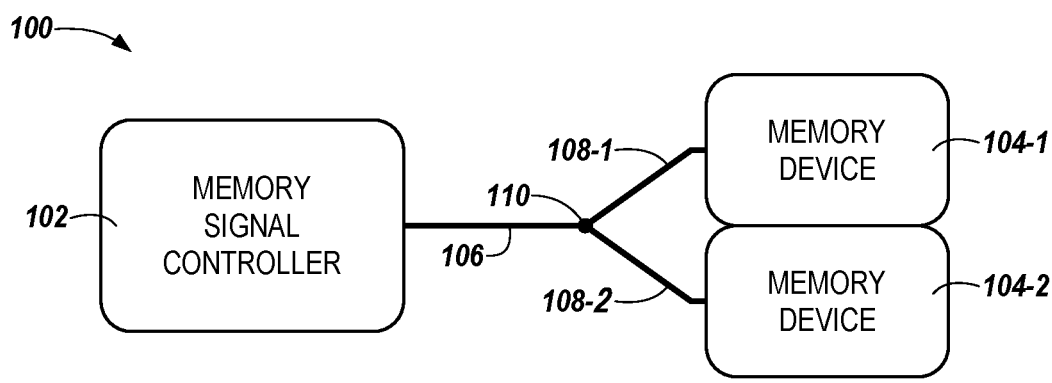

FIG. 1C illustrates a block diagram of the apparatus 100 including a memory signal controller 102 communicatively coupled to a plurality of memory devices 104-1 . . . 104-N via a command/address signal trace. FIG. 1C illustrates the apparatus 100 arranged in a star topology. Specifically, FIG. 1C illustrates the apparatus arranged in a star 2 topology.

The star 2 topology may refer to a memory signal controller 102 communicatively coupled to a plurality of memory devices 104-1 . . . 104-2 via a command/address signal trace that is split between memory device 104-1 . . . 104-2 loads. A star 2 topology may include an arrangement where the memory signal controller 102 is communicatively coupled to a plurality of memory devices 104-1 . . . 104-2 via a command/address signal trace including a trunk portion 106, a branch point 110, and/or a plurality of branch portions 108-1 . . . 108-2. In some examples, the plurality of memory devices 104-1 . . . 104-2 may be arranged as a clam-shelled pair on the apparatus 100. Conversely, the plurality of memory devices 104-1 . . . 104-2 may be arranged as individual spaced apart memory devices on the apparatus 100 located at different X/Y plane positions.

In some examples, a trunk portion 106 may include a portion of the command/address signal trace that is coupled to an output pin of the memory signal controller 102 on one end and which splits at a branch point 110 opposite the end coupled to the output pin of the memory signal controller 102. The branch point 110 may include a portion of the command/address signal trace where the trunk portion 106 is split into the plurality of branch portions 108-1 . . . 108-N. Each branch portion 108-1 . . . 108-2 may include a portion of the command/address signal trace that extends from the branch point 110 on one end to a respective memory device on the other end.

A star 2 topology may include an arrangement where the memory signal controller 102 is communicatively coupled to two memory devices 104-1 and 104-2 via a command/ address signal trace including a trunk portion 106, a branch point 110, and/or two branch portions 108-1 and 108-2. The two branch portions 108-1 and 108-2 may be matched. As used herein, a matched branch portion may include a branch portion that is length-matched to the lengths of other branch portions on the same signaling net, impedance matched to the impedance of other branch portions on the same signaling net, and/or one of a plurality of branch portions on a same signaling net the parallel combination of which is impedance matched to the impedance of its connected trunk portion.

For example, the length of the first branch portion 108-1 may be the same length as the second branch portion 108-2. The matched lengths of the two branch portions 108-1 and 108-2 may create a symmetry after the branch point 110 that preserves signal integrity by minimizing reflections caused by unequal trace lengths and/or unequal spacing from the memory signal controller 102/branch point 110 along a trace. Length-matching may be applied, in some examples, only within a same physical signaling net. For example, length matching may not be applied between branch lengths of different physical signaling nets.

In addition, the trunk portion 106 and the branch portions 108-1 . . . 108-2 may be impedance matched. For example, the impedance of each of the two branch portions 108-1 . . . 1082 may be matched. For example, the two branch portions 108-1 . . . 108-2 may be configured to have the same impedance value. For example, the first branch portion 108-1 may have an impedance value of 40 ohm and the second branch portion 108-2 may have an impedance value of 40 ohm, Additionally, the impedance within the trunk portion 106 of the signal trace may be matched to the impedance within the two branch portions 108-1 and 108-2. For example, the parallel combination of two branch portions 108-1 and 108-2 may have the same impedance value as the trunk 106. For example, the branch portions 108-1 and 108-2 may have impedance values of 40 ohm respectively which, in parallel combination, will match the 20-ohm impedance value of the trunk portion 106. As such, impedance matching the trunk portion 106 to the branch portions 108-1 . . . 108-2 may include creating a relatively low impedance in the trunk portion 106 and relatively high impedance in the branch portions 108-1 . . . 108-2 such that the signal reflection that occurs when a signal reaches the branch point 110 and splits off into the branch portions 108-1 . . . 108-2 is minimized.

In order to achieve a targeted impedance and/or to achieve impedance matching in a signal trace, the signal may be configured in various ways. For example, various materials may be utilized to form the trace. In some examples, different materials may be utilized in the trunk portion 106 than those utilized in the branch portions 108-1 and 108-2 in order to match the impedance associated with signals traveling through with the trunk portion 106 to the impedance associated with signals traveling through the branch portions 108-1 . . . 108-2.

Further, the dimensions (e.g., width) of the trace may be different in the trunk portion 106 than those in the branch portions 108-1 and 108-2 in order to match the impedance associated with signals traveling through with the trunk portion 106 to the impedance associated with signals traveling through the branch portions 108-1 . . . 108-2. For example, a trunk portion 106 may be formed to have a first width producing a first level of impedance and each of the branch portions 108-1 . . . 108-2 may be formed having a second width, narrow than the first width, producing a second level of impedance that is higher than the first level of impedance.

Furthermore, the layering of the trace may be varied to achieve a targeted impedance and/or to achieve impedance matching. For example, it may be that the trunk portion 106 may be placed on a signal layer with closer spacing to reference plane than the portions 108-1 . . . 108-2 which may be on a layer with farther spacing to the reference plane, thereby matching the impedance associated with signals traveling through with the trunk portion 106 to the impedance associated with signals traveling through the branch portions 108-1 . . . 108-2.

The memory devices 104-1 and 104-2 may share access to a common signal trace. For example, the memory devices 104-1 and 104-2 may be connected to a common trunk portion 106 via their respective branch portions 108-1 and 108-2 at a branch point 110. As such, a single command/address signal may be driven down the trunk portion 106, split among the plurality of branch portions 108-1 . . . 108-2, and sent to both memory devices 104-1 and 104-2. As such, a single command/address signal generated and/or driven by the memory signal controller 102 may be utilized to access both memory devices 104-1 and 104-2 of a clam-shelled pair.

Figure 1D:
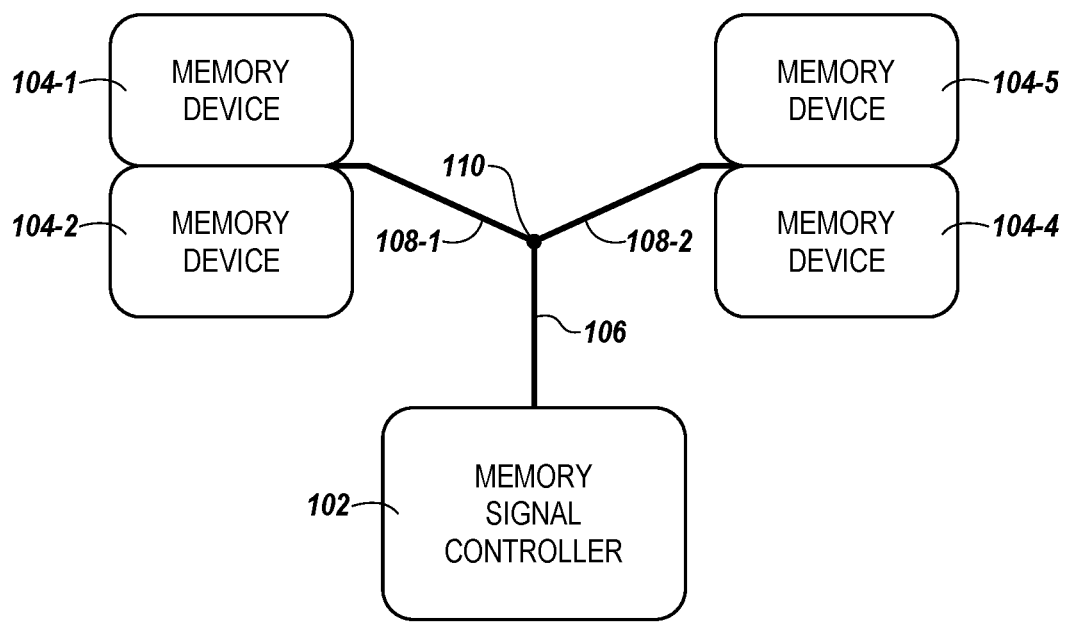

FIG. 1D illustrates a block diagram of the apparatus 100 including a memory signal controller 102 communicatively coupled to a plurality of memory devices 104-1 . . . 104-N via a command/address signal trace. FIG. 1C illustrates the apparatus 100 arranged in a star topology. Specifically, FIG. 1C illustrates the apparatus arranged in a star 4 topology.

In FIG. 1D, the star 4 topology includes a memory signal controller 102 communicatively coupled to a plurality of memory devices 104-1 . . . 104-4 via a command/address signal trace that is split between pairs of memory device 104-1 . . . 104-4 loads. The star 4 topology includes an arrangement where the memory signal controller 102 is communicatively coupled to a plurality of memory devices 104-1 . . . 104-4 via a command/address signal trace including a trunk portion 106, a branch point 110, and/or a plurality of branch portions 108-1 . . . 108-2. The plurality of memory devices 104-1 . . . 104-4 are arranged in clam-shelled pairs (e.g., a first clam-shelled pair 104-1 and 104-2 and a second clam-shelled pair 104-3 and 104-4) on the apparatus 100.

In FIG. 1D, a trunk portion 106 may include a portion of the command/address signal trace is coupled to an output pin of the memory signal controller 102 on one end and splits at a branch point 110 opposite the end coupled to the output pin of the memory signal controller 102. The branch point 110 may include a portion of the command/address signal trace where the trunk portion 106 is split into the plurality of branch portions 108-1 . . . 108-2. Each branch portion 108-1 . . . 108-2 may include a portion of the split command/address signal trace that extends from the branch point 110 on one end to a respective clam-shelled pair of memory devices on the other end (e.g., branch portion 108-1 extending from branch point 110 to clam-shelled pair of memory devices 104-1 and 104-2 and branch portion 108-2 extending from branch point 110 to clam-shelled pair of memory devices 104-3 and 104-4).

A star 4 topology may include an arrangement where the memory signal controller 102 is communicatively coupled to four memory devices 104-1, 104-2, 104-3, and 104-4 via a command/address signal trace including a trunk portion 106, a branch point 110, and/or two branch portions 108-1 and 108-2. The two branch portions 108-1 and 108-2 may be matched. For example, the two branch portions 108-1 and 108-2 may be length-matched to each other, impedance matched to each other, and/or be impedance matched as a parallel combination to the impedance of its connected trunk portion 106. For example, the length of the first branch portion 108-1 may be the same length as the second branch portion 108-2. The matched lengths of the two branch portions 108-1 and 108-2 may create a symmetry after the branch point 110 that preserves signal integrity by minimizing reflections caused by unequal trace lengths and/or unequal spacing from the memory signal controller 102/branch point 110 along a trace.

In addition, the trunk portion 106 and the branch portions 108-1 . . . 108-2 may be impedance matched to each other. Further, the impedance within the trunk portion 106 of the signal trace may be matched to the impedance of the parallel combination of the two branch portions 108-1 and 108-2. Impedance matching the trunk portion 106 to the branch portions 108-1 . . . 108-2 may include creating a relatively low impedance in the trunk portion 106 and relatively high impedance in the branch portions 108-1 . . . 108-2 such that the signal reflection that occurs when a signal reaches the branch point 110 and splits off into the branch portions 108-1 . . . 108-2 is minimized.

For example, the materials utilized to form the trace and/or the dimensions (e.g., width) of the trace may be different in the trunk portion 106 than those in the branch portions 108-1 and 108-2 in order to match the impedance associated signals traveling through with the trunk portion 106 to the impedance associated with signals traveling through the branch portions 108-1 . . . 108-2. For example, a trunk portion 106 may be formed to have a first width producing a first level of impedance and each of the branch portions 108-1 . . . 108-2 may be formed having a second width, narrow than the first width, producing a second level of impedance that is higher than the first level of impedance.

The memory devices 104-1 . . . 104-4 may share access to a common signal trace. For example, the clam-shelled pairs of memory devices 104-1 . . . 104-4 (e.g., a first clam-shelled pair of memory devices 104-1 and 104-2 and a second clam-shelled pair of memory devices 104-3 and 104-4) may be connected to a common trunk portion 106 via their respective branch portions 108-1 and 108-2 at a branch point 110. As such, a single command/address signal may be driven down the trunk portion 106, split among the plurality of branch portions 108-1 . . . 108-2, and sent to both clam-shelled pairs of memory devices 104-1 . . . 104-4. As such, a single command/address signal generated and/or driven by the memory signal controller 102 may be utilized to access all the memory devices 104-1 . . . 104-4 in clam-shelled pairs.

Figure 1E:
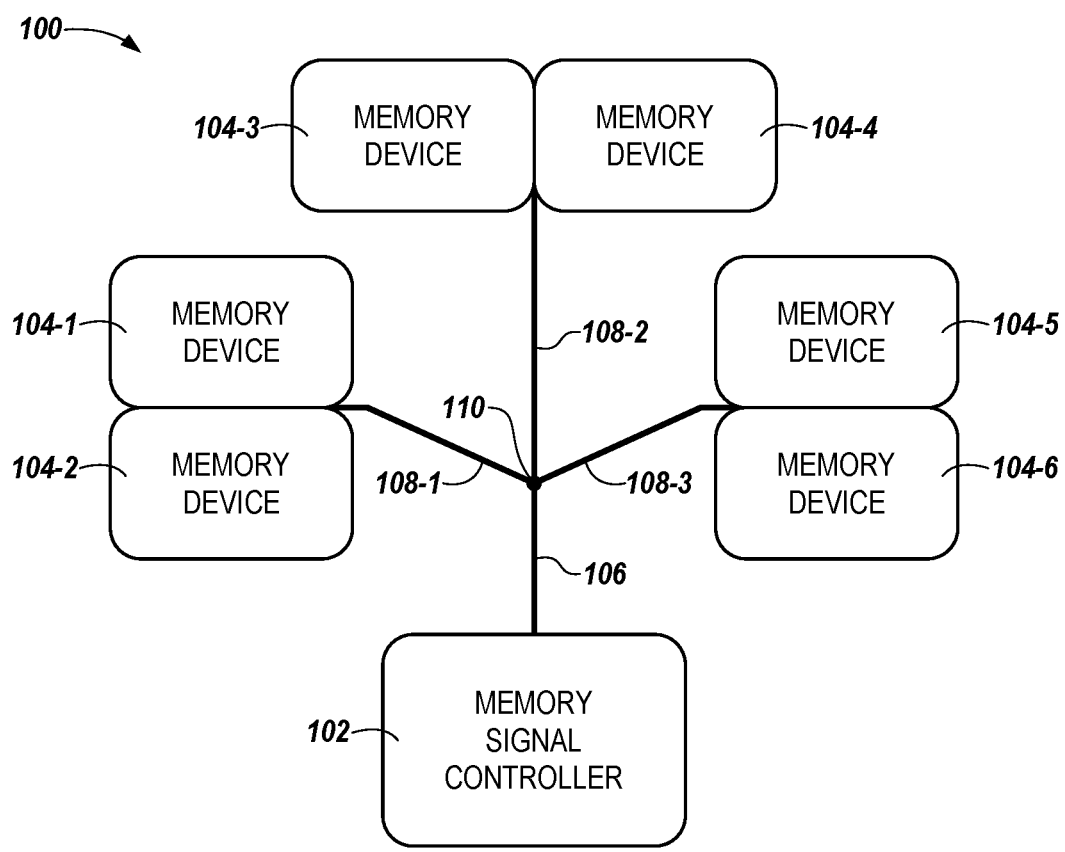

FIG. 1E illustrates a block diagram of the apparatus 100 including a memory signal controller 102 communicatively coupled to a plurality of memory devices 104-1 . . . 104-N via a command/address signal trace. FIG. 1D also illustrates the apparatus 100 arranged in a star topology. Specifically, FIG. 1E illustrates the apparatus arranged in a star 6 topology.

In FIG. 1E, the star 6 topology includes a memory signal controller 102 communicatively coupled to a plurality of memory devices 104-1 . . . 104-6 via a command/address signal trace that is split between pairs of memory device 104-1 . . . 104-6 loads. The star topology includes an arrangement where the memory signal controller 102 is communicatively coupled to a plurality of memory devices 104-1 . . . 104-6 via a command/address signal trace including a trunk portion 106, a branch point 110, and/or a plurality of branch portions 108-1 . . . 108-3. The plurality of memory devices 104-1 . . . 104-6 are arranged in clam-shelled pairs (e.g., a first clam-shelled pair 104-1 and 104-2, a second clam-shelled pair 104-3 and 104-4, and a third clam-shelled pair 104-5 and 104-6) on the apparatus 100.

In FIG. 1E, a trunk portion 106 may include a portion of the command/address signal trace is coupled to an output pin of the memory signal controller 102 on one end and splits at a branch point 110 opposite the end coupled to the output pin of the memory signal controller 102. The branch point 110 may include a portion of the command/address signal trace where the trunk portion 106 is split into the plurality of branch portions 108-1 . . . 108-3. Each branch portion 108-1 . . . 108-3 may include a portion of the split command/address signal trace that extends from the branch point 110 on one end to a respective clam-shelled pair of memory devices on the other end (e.g., branch portion 108-1 extending from branch point 110 to clam-shelled pair of memory devices 104-1 and 104-2, branch portion 108-2 extending from branch point 110 to clam-shelled pair of memory devices 104-3 and 104-4, and branch portion 108-3 extending from branch point 110 to clam-shelled pair of memory devices 104-5 and 104-6).

A star 6 topology may include an arrangement where the memory signal controller 102 is communicatively coupled to six memory devices 104-1, 104-2, 104-3, 104-4, 104-5, and 104-6 via a command/address signal trace including a trunk portion 106, a branch point 110, and/or three branch portions 108-1, 108-2, and 108-3.

The three branch portions 108-1 and 108-N may be matched. For example, the branch portions 108-1 . . . 108-3 may be length-matched to each other, impedance matched to each other, and/or be impedance matched as a parallel combination to the impedance of its connected trunk portion 106. For example, the length of the first branch portion 108-1 may be the same length as the second branch portion 108-3, which may also be the same length as the third branch portion 108-3. The matched lengths of the three branch portions 108-1, 108-2, and 108-3 may create a symmetry after the branch point 110 that preserves signal integrity by minimizing reflections caused by unequal trace lengths and/or unequal spacing from the memory signal controller 102/branch point 110 along a trace.

In addition, the trunk portion 106 and the branch portions 108-1 . . . 108-3 may be impedance matched. For example, the branch portions 108-1 . . . 108-3 may be impedance matched to each other. Further, the impedance within the trunk portion 106 of the signal trace may be matched to the impedance of the parallel combination of the three branch portions 108-1, 108-2, and 108-3. Impedance matching the trunk portion 106 to the branch portions 108-1 . . . 108-3 may include creating a relatively low impedance in the trunk portion 106 and relatively high impedance in the branch portions 108-1 . . . 108-3 such that the signal reflection that occurs when a signal reaches the branch point 110 and splits off into the branch portions 108-1 . . . 108-3 is minimized.

For example, the materials utilized to form the trace, the dimensions (e.g., width) of the trace, and/or material layering of the trace may be different in the trunk portion 106 than those in the branch portions 108-1 and 108-2 in order to match the impedance associated signals traveling through with the trunk portion 106 to the impedance associated with signals traveling through the branch portions 108-1 . . . 108-3. For example, a trunk portion 106 may be formed to have a first width producing a first level of impedance and each of the branch portions 108-1 . . . 108-3 may be formed having a second width, narrow than the first width, producing a second level of impedance that is higher than the first level of impedance.

The memory devices 104-1 . . . 104-6 may share access to a common signal trace. For example, the clam-shelled pairs of memory devices 104-1 . . . 104-6 (e.g., a first clam-shelled pair of memory devices 104-1 and 104-2, a second clam-shelled pair of memory devices 104-3 and 104-4, and a third pair of memory devices 104-5 and 104-6) may be connected to a common trunk portion 106 via their respective branch portions 108-1, 108-2, 108-3 at a branch point 110. As such, a single command/address signal may be driven down the trunk portion 106, split among the plurality of branch portions 108-1 . . . 108-3, and sent to the three clam-shelled pairs of memory devices 104-1 . . . 104-6. As such, a single command/address signal generated and/or driven by the memory signal controller 102 may be utilized to access all the memory devices 104-1 . . . 104-6 in clam-shelled pairs.

Figure 2:
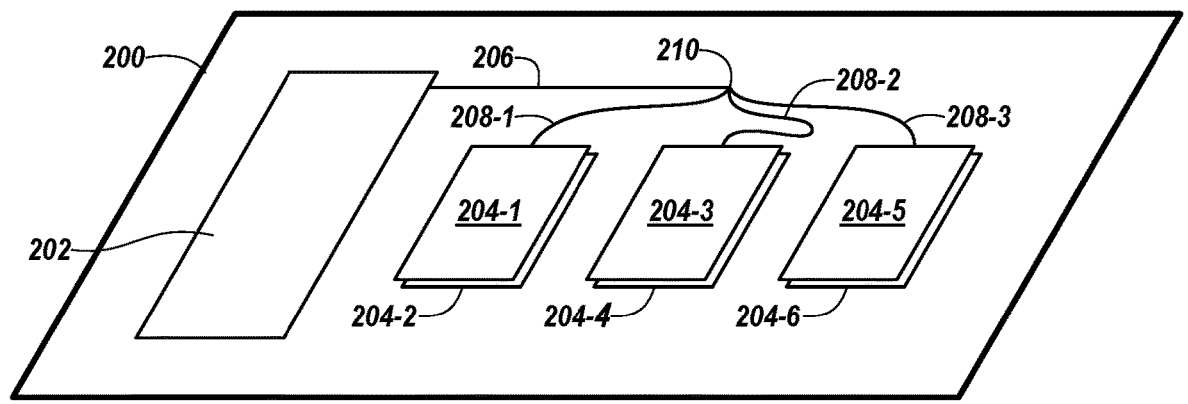
FIG. 2 illustrates an apparatus 200 having a memory device connection topology consistent with a number of embodiments of the present disclosure.

FIG. 2 illustrates an apparatus 200 having a memory device connection topology consistent with a number of embodiments of the present disclosure. The described components, configurations, and/or operation of the apparatus described with respect to FIG. 2 may include and/or be interchanged with the described components, configurations, and/or operations in relation to FIGS. 1A-1D, FIG. 3, FIG. 4, and/or FIG. 5.

The apparatus 200 may be a portion of a DIMM. The apparatus 200 may be arranged in a star 6 topology.

The apparatus 200 may include a memory signal controller 202. The memory signal controller 202 may include an RCD, a data buffer, and/or a data buffer additionally capable of performing the functionality of the RCD. In some examples, the memory signal controller 202 is an RCD without a buffer or additional control logic. The memory signal controller 202 may be connected to a bus or buses, and may communicate with a host device (e.g., CPU, GPU, GPGPU, SOC, etc.) which may include a memory controller or memory controller functionality.

The apparatus 200 may include a plurality of memory devices 204-1 . . . 204-N. The plurality of memory devices 204-1 . . . 204-N may include DRAM memory devices mounted to the apparatus 200.

The plurality of memory devices 204-1 . . . 204-N may be arranged in clam-shelled pairs (e.g., a first clam-shelled pair including memory devices 204-1 and 204-2, a second clam-shelled pair including memory devices 204-3 and 204-4, and a third clam-shelled pair including memory devices 204-4 and 204-N).

The memory signal controller 202 may be communicatively coupled to the plurality of memory devices 204-1 . . . 204-N. The plurality of memory devices 204-1 . . . 204-N may store bits of data that are able to be operated on utilizing command/address signals from the memory signal controller 202 across a signal trace communicatively coupling the plurality of memory devices 204-1 . . . 204-N to the memory signal controller 202.

The signal trace may include a trunk portion 206, a branch point 210, and a plurality of branch portions 208-1 . . . 208-N. Each branch portion 208-1 . . . 208-N may span from the branch point 210 to a corresponding clam-shelled pair of memory devices 204-1 . . . 204-N. The branch portions 208-1 . . . 208-N may be matched. For example, the branch portions 208-1 . . . 208-N may be length-matched to each other, impedance matched to each other, and/or be impedance matched as a parallel combination to the impedance of its connected trunk portion 206. For example, each branch portion 208-1 . . . 208-N on a same signal net may be length-matched. For example, each branch portion 208-1 . . . 208-N of the signal trace may be a same length.

In some examples, the clam-shelled pairs of memory devices 204-1 . . . 204-N may be mounted to the apparatus at differing distances from the memory signal controller 202. For example, the clam-shelled pairs of memory devices 204-1 . . . 204-N may be mounted to the apparatus arranged in rows extending away from the memory signal controller 202, although other geometries are contemplated. As illustrated in FIG. 2, such an arrangement may result in a first clam-shelled pair of memory devices 204-1 . . . 204-2 being closer to a memory signal controller 202 than a second clam-shelled pair of memory devices 204-3 . . . 204-4, which is itself closer to the memory signal controller 202 than a third clam-shelled pair of memory devices 204-5 . . . 204-N.

FIG. 2 illustrates the apparatus 200 arranged in a star 6 topology. For example, the memory signal controller 202 is communicatively coupled to each of a plurality of clam-shelled pairs of memory devices 204-1 . . . 204-N by a signal trace including a trunk portion 206, a branch point 210, and a plurality of branch portions 208-1 . . . 208-N. As was the case with the relative distance to the memory signal controller 202, as a result of the spacing of the mounted clam-shelled pairs of memory devices 204-1 . . . 204-N the clam-shelled pairs of memory devices 204-1 . . . 204-N may be located at differing distances from a branch point 210 of the signal trace. As depicted in the example illustrated in FIG. 2, the second clam-shelled pair of memory devices 204-3 . . . 204-4 may be closer to the branch point 210 than the first clam-shelled pair of memory devices 204-1 . . . 204-2 and the third clam-shelled pair of memory devices 204-5 . . . 204-N. In some examples, the first clam-shelled pair of memory devices 204-1 . . . 204-2 and the third clam-shelled pair of memory devices 204-5 . . . 204-N may be an equal distance, although in opposing directions, from the branch point 210 of the signal trace.

However, as described above, the branch portions 208-1 . . . 208-N may be length matched in order to preserves signal integrity by minimizing reflections caused by unequal trace lengths and/or unequal distance from the memory signal controller 202 and/or the branch point 210 of the signal trace coupled to the memory signal controller 202. In order to achieve length matched branch portions 208-1 . . . 208-N, a portion of the branch portions (e.g., branch portion 208-2) may be formed in a relatively more meandering, non-direct, and/or serpentine path form the branch point 210 to it corresponding clam-shelled pair of memory devices (e.g., memory devices 204-3 and 204-4). Other portions of the branch portions (e.g., branch portion 208-1 and branch portion 208-N) may be formed in a relatively less meandering, more direct, and/or less serpentine path form the branch point 210 to it corresponding clam-shelled pair of memory devices (e.g., memory devices 204-1 and 204-2, and memory devices 204-5 and 204-N, respectively). For example, despite the increased manufacturing complexity, branch portions of the signal trace extending to closer (relative to a branch point) clam-shelled pairs of memory devices may be routed in more complex and/or meandering geometries in order to form a branch portion length matched to the branch portions connecting in a more direct route to the more distally located (relative to a branch point) clam-shelled pairs of memory devices. For example, the additional complexity associated with forming a meandering branch portion to a portion of the clam-shelled pairs of memory devices may be elected in order to preserve length matching and its resulting signal integrity preservation.

Additionally, the trunk portion 206 and the branch portions 208-1 . . . 208-N may be impedance matched. For example, the branch portions 208-1 . . . 208-N may have a same impedance value. Further, the branch portions 208-1 . . . 208-N may, as a parallel combination, have a same impedance value as the trunk 206 of the signal trace. For example, trunk portion 206 may be formed to have a relatively low impedance and the three branch portions 208-1, 208-2, and 208-N may be formed to have a relatively higher impedance.

The star topology including length matching between respective branch portions 208-1 . . . 208-N and/or the impedance matching between the trunk portion 206 and the branch portions 208-1 . . . 208-N may produce fewer and/or more symmetrical signal reflections within the signal trace. As such, a command/address signals driven through the signal trace to the plurality of memory devices 204-1 . . . 204-N may retain an open and symmetrical data signal eye across all of the receiving memory devices 204-1 . . . 204-N.

The memory devices 204-1 . . . 204-N may share access to a common signal trace. For example, the clam-shelled pairs of memory devices 204-1 . . . 204-N (e.g., a first clam-shelled pair of memory devices 204-1 and 204-2, a second clam-shelled pair of memory devices 204-3 and 204-4, and a third pair of memory devices 204-5 and 204-N) may be connected to a common trunk portion 206 via their respective branch portions 208-1, 208-2, 208-N at a branch point 210. As such, a single command/address signal may be driven from the memory signal controller 202 down the trunk portion 206, split among the plurality of branch portions 208-1 . . . 208-N, and sent to the three clam-shelled pairs of memory devices 204-1 . . . 204-N. As such, a single command/address signal generated and/or driven by the memory signal controller 202 may be utilized to access all the memory devices 204-1 . . . 204-N in clam-shelled pairs.

Figure 3:
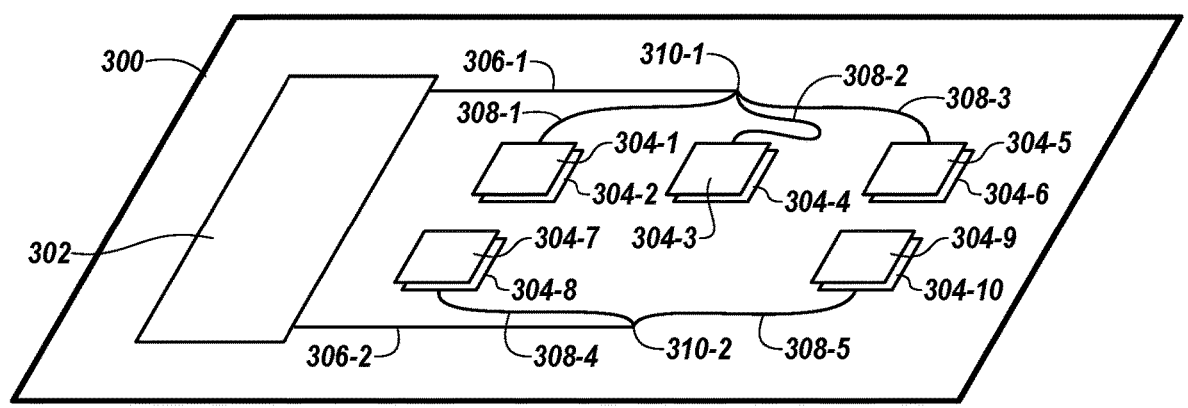
FIG. 3 illustrates an apparatus 300 having a memory device connection topology consistent with a number of embodiments of the present disclosure.

FIG. 3 illustrates an apparatus 300 having a memory device connection topology consistent with a number of embodiments of the present disclosure. The described components and/or operation of the apparatus described with respect to FIG. 3 may include and/or be interchanged with the described components and/or operations in relation to FIGS. 1A-1D, FIG. 2, FIG. 4, and/or FIG. 5.

The apparatus 300 may be a portion of a DIMM. The apparatus 300 may include a plurality of memory devices 304-1 . . . 304-N communicatively coupled to a memory signal controller 302. The plurality of memory devices 304-1 . . . 304-N may be DRAM devices.

FIG. 3 illustrates an example of an apparatus 300 including a first plurality of clam-shell paired memory devices 304-1 . . . 304-6. The first plurality of clam-shell paired memory devices 304-1 . . . 304-6 may be arranged in a star connection topology, each clam-shelled pair of the first plurality of memory devices being coupled by a respective matched (e.g., length, impedance, etc.) branch 308-1, 308-2, 308-3 to a first common command/address signal trace (e.g., trunk portion 306-1). For example, each clam-shelled pair of the first plurality of memory devices may be coupled to a memory signal controller 302 by via their respective length-matched branch 308-1, 308-2, 308-3 and the first common command/address signal trace (e.g., trunk portion 306-1). The apparatus 300 may include a second plurality of memory devices 304-7 . . . 304-N coupled to a second common command/address signal trace (e.g., trunk portion 306-2).

The memory signal controller 302 may include a register clock driver (RCD) component configured to transmit a first copy of a command/address signal to the first plurality of memory devices 304-1 . . . 304-6 by the first common command/address signal trace and/or to transmit a second copy of a command/address signal to the second plurality of memory devices 304-7 . . . 304-N by the second common command/address signal trace 306-2. Alternatively, the memory signal controller 302 may include a data buffer component configured to transmit a first copy of a command/address signal to the first plurality of memory devices 304-1 . . . 304-6 by the first common command/address signal trace 306-1 and/or to transmit a second copy of a command/address signal to the second plurality of memory devices 304-7 . . . 304-N by the second common command/address signal trace 306-2, in addition to being configured to communicate data to be read or written between the first plurality of memory devices 304-1 . . . 304-6 and a host and/or the second plurality of memory devices 304-7 . . . 304-N and a host.

The memory signal controller 302 may drive command/address signals to ten memory devices per subchannel. In some examples, a single memory signal controller 302 may handle signal communication with two distinct subchannels, each sub-channel populated by ten memory devices. In such examples, memory devices coupled to a same subchannel of the memory signal controller 302 may receive separate copies of the command/address signal sent to the first subchannel from the host. For example, the first plurality of memory devices 304-1 . . . 304-6 may be coupled to a first subchannel of the memory signal controller 302 and the second plurality of memory devices 304-7 . . . 304-N may be coupled to the first subchannel of the memory signal controller 302. However, the first plurality of memory devices 304-1 . . . 304-6 and the second plurality of memory devices 304-7 . . . 304-N may receive separate copies of a command/address signal, generated by the memory signal controller 302, sent across the first subchannel from the host.

A first plurality of memory devices 304-1 . . . 304-6 may be mounted to the apparatus as clam-shelled pairs. For example, the first plurality of memory devices 304-1 . . . 304-6 may be mounted to the apparatus as three clam-shelled pairs including a first clam-shell pair 304-1 and 304-2, a second clam-shell pair 304-3 and 304-4, and a third claim-shell pair 304-5 and 304-6.

Each of the clam-shelled pairs of the first plurality of memory devices 304-1 . . . 304-6 may be coupled by a respective length-matched branch portion 308-1 . . . 308-3 of a signal trace to a first common command/address signal trace (e.g., trunk portion 306-1 of the signal trace spanning between the memory signal controller 302 and the branch point 310-1). A branch portion 308-2 of the signal trace coupled to the second clam-shelled pair 304-3 and 304-4 may be routed in a meandering, indirect, and/or serpentine path from the branch point 310-1 of the signal trace to the clam-shelled pair 304-3 and 304-4 such that the branch portion 308-2 is length matched to the other branch portions 308-1 and 308-3 despite being located closer to the branch point 310-1 than the other clam-shelled pairs. For example, each branch trace 308-1 . . . 308-3 spanning between each clam-shelled pair of the first plurality of memory devices 304-1 . . . 304-6 and the branch point 310-1 may have a same length regardless of its proximity to the branch point 310-1. Again, this may be accomplished by routing a branch portion of a clam-shelled pair of memory devices relatively proximate to the branch point in a meandering, non-direct, and/or serpentine path between the branch point and the clam-shelled pair. Whereas, the branch portion of a clam-shelled pair of memory devices relatively distal from the branch point may be routed in a relatively less meandering, more direct, and/or non-serpentine path between the branch point and the clam-shelled pair.

At one end, each branch portion 308-1 . . . 308-3 may be coupled to a corresponding clam-shelled pair of memory devices at a via between the corresponding clam-shelled memory device and, at the other end, each branch portion 308-1 . . . 308-N may be coupled to the common signal trace trunk portion 306-1 at the branch point 310-1. The common signal trace trunk portion 306-1 may communicatively couple the first plurality of memory devices 304-1 . . . 304-6 attached at the branch point 310-1 to the memory signal controller 302 of the apparatus 300.

A second plurality of memory devices 304-7 . . . 304-N may be mounted to the apparatus 300 as clam-shelled pairs. For example, the second plurality of memory devices 304-7 . . . 304-N may be mounted to the apparatus 300 as a first clam-shell pair 306-7 and 306-8 and a second clam-shell pair 304-9 and 304-N. Each of the clam-shelled pairs of the second plurality of memory devices 304-7 . . . 304-N may be coupled by a respective matched (e.g., length, impedance, etc.) branch portion 308-4 . . . 308-N of a signal trace to a second common command/address signal trace trunk portion 306-2. The common signal trace trunk portion 306-2 may communicatively couple the second plurality of memory devices 304-7 . . . 304-N to the memory signal controller 302 of the apparatus 300. Like with the first plurality of memory devices 304-1 . . . 304-6, the branch portions 308-4 . . . 308-N may be length matched and/or may utilize differential (e.g., direct vs. non-direct) routing to achieve length matched branch portions 308-4 . . . 308-N among claim-shelled pairs of memory devices having differential spacing from the branch point 310-2.

In FIG. 3, the first plurality of memory devices 304-1 . . . 304-6 are illustrated as six memory devices arranged in three clam-shelled pairs communicatively coupled to the memory signal controller 302 in a star topology (e.g., a star 6 topology). However, examples consistent with the present disclosure are not so limited. Likewise, FIG. 3 illustrates the second plurality of memory devices 304-7 . . . 304-N as four memory devices arranged in two clam-shelled pairs coupled to the memory signal controller in a star 4 topology. Again, examples consistent with the present disclosure are not so limited.

The apparatus 300 of FIG. 3 illustrated with the star 6 plus star 4 topology may be operated utilizing two command/address signal copies per sub-channel. For example, the memory signal controller 302 may generate and/or drive two copies of an incoming command/address signal: one sent along the first trunk portion 306-1 to the first plurality of memory devices 304-1 . . . 304-6 and one sent along the separate second trunk portion 306-2 to the second plurality of memory devices 304-7 . . . 304-N.

As described in the previous examples, the branch portions 308-1 . . . 308-3 on the same signal net may be impedance matched to one another and/or the parallel combination of branch portions 308-1 . . . 308-3 may be impedance matched to the trunk portion 306-1. For example, the trunk portion 306-1 may be impedance matched to the parallel combination of its connected branch portions 308-1 . . . 308-3. For example, the first common command/address signal trace 306-1 may have a first width, wherein each respective length-matched branch 308-1 . . . 308-3 has a second width, and wherein the first width is greater than the second width. Also, the first common command/address signal trace 306-1 have an inner layer with a first impedance, wherein each respective length-matched branch 308-1 . . . 308-3 has an inner layer with a second impedance, and wherein the second impedance is greater than the first impedance. Likewise, the trunk portion 306-2 may be impedance matched to its connected branch portions 308-4 . . . 308-N.

Figure 4:
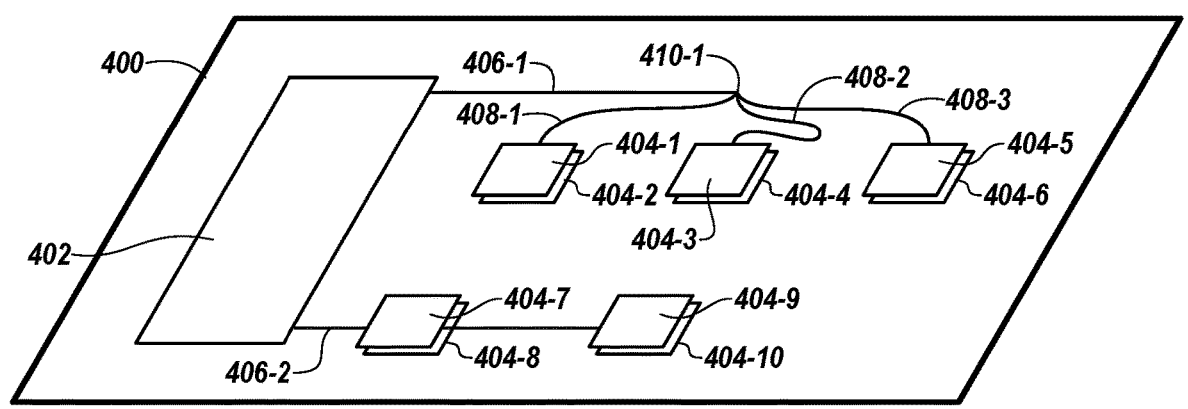
FIG. 4 illustrates an apparatus 400 having a memory device connection topology consistent with a number of embodiments of the present disclosure.

FIG. 4 illustrates an apparatus 400 having a memory device connection topology consistent with a number of embodiments of the present disclosure. The described components and/or operation of the apparatus described with respect to FIG. 4 may include and/or be interchanged with the described components and/or operations in relation to FIGS. 1A-1D, FIG. 2, FIG. 3, and/or FIG. 5.

The apparatus 400 may be a portion of a DIMM. The apparatus 400 may include a plurality of memory devices 404-1 . . . 404-N communicatively coupled to a memory signal controller 402. The plurality of memory devices 404-1 . . . 404-N may be DRAM devices.

The apparatus 400 includes a first plurality of memory devices 404-1 . . . 404-6. The first plurality of clam-shell paired memory devices 404-1 . . . 404-6 may be arranged in a star connection topology, each clam-shelled pair of the first plurality of memory devices being coupled by a respective matched (e.g., length, impedance, etc.) branch 408-1, 408-2, 408-3 to a first common command/address signal trace (e.g., trunk portion 406-1). For example, each clam-shelled pair of the first plurality of memory devices may be coupled to a memory signal controller 402 by via their respective length-matched branch 408-1, 408-2, 408-3 and the first common command/address signal trace (e.g., trunk portion 406-1). The apparatus 400 may include a second plurality of memory devices 404-7 . . . 404-N coupled to a second common command/address signal trace (e.g., trunk portion 406-2).

The memory signal controller 402 may include a register clock driver (RCD) component configured to transmit a first copy of a command/address signal to the first plurality of memory devices 404-1 . . . 404-6 by the first common command/address signal trace and/or to transmit a second copy of a command/address signal to the second plurality of memory devices 404-7 . . . 404-N by the second common command/address signal trace 406-2. Alternatively, the memory signal controller 402 may include a data buffer component configured to transmit a first copy of a command/address signal to the first plurality of memory devices 404-1 . . . 404-6 by the first common command/address signal trace 406-1 and/or to transmit a second copy of a command/address signal to the second plurality of memory devices 404-7 . . . 404-N by the second common command/address signal trace 406-2, in addition to being configured to communicate data to be read or written between the first plurality of memory devices 404-1 . . . 404-6 and a host and/or the second plurality of memory devices 404-7 . . . 404-N and a host.

The memory signal controller 402 may drive command/address signals to ten memory devices per subchannel. In some examples, a single memory signal controller 402 may handle signal communication with two distinct subchannels, each sub-channel populated by ten memory devices. In such examples, memory devices coupled to a same subchannel of the memory signal controller 402 may receive separate copies of the command/address signal sent to the first subchannel from the host. For example, the first plurality of memory devices 404-1 . . . 404-6 may be coupled to a first subchannel of the memory signal controller 402 and the second plurality of memory devices 404-7 . . . 404-N may be coupled to the first subchannel of the memory signal controller 402. However, the first plurality of memory devices 404-1 . . . 404-6 and the second plurality of memory devices 404-7 . . . 404-N may receive separate copies of a command/address signal, generated by the memory signal controller 402, sent across the first subchannel from the host.

A first plurality of memory devices 404-1 . . . 404-6 may be mounted to the apparatus as clam-shelled pairs. For example, the first plurality of memory devices 404-1 . . . 404-6 may be mounted to the apparatus as three clam-shelled pairs including a first clam-shell pair 404-1 and 404-2, a second clam-shell pair 404-3 and 404-4, and a third claim-shell pair 404-5 and 404-6.

Each of the clam-shelled pairs of the first plurality of memory devices 404-1 . . . 404-6 may be coupled by a respective matched (e.g., length, impedance, etc.) branch portion 408-1 . . . 408-3 of a signal trace to a first common command/address signal trace (e.g., trunk portion 406-1 of the signal trace spanning between the memory signal controller 402 and the branch point 410-1). A branch portion 408-2 of the signal trace coupled to the second clam-shelled pair 404-3 and 404-4 may be routed in a meandering, indirect, and/or serpentine path from the branch point 410-1 of the signal trace to the clam-shelled pair 404-3 and 404-4 such that the branch portion 408-2 is length matched to the other branch portions 408-1 and 408-3 on the same signal net despite being located closer to the branch point 410-1 than the other clam-shelled pairs. For example, each branch trace 408-1 . . . 408-3 between each clam-shelled pair of the first plurality of memory devices 404-1 . . . 404-6 and the branch point 410-1 may have a same length regardless of its proximity to the branch point 410-1. Again, this may be accomplished by routing a branch portion of a clam-shelled pair of memory devices relatively proximate to the branch point in a meandering, non-direct, and/or serpentine path between the branch point and the clam-shelled pair. Whereas, the branch portion of a clam-shelled pair of memory devices relatively distal from the branch point may be routed in a relatively less meandering, more direct, and/or non-serpentine path between the branch point and the clam-shelled pair.

At one end, each branch portion 408-1 . . . 408-3 may be coupled to a corresponding clam-shelled pair of memory devices at a via between the corresponding clam-shelled memory device and, at the other end, each branch portion 408-1 . . . 408-N may be coupled to the common signal trace trunk portion 406-1 at the branch point 410-1. The common signal trace trunk portion 406-1 may communicatively couple the first plurality of memory devices 404-1 . . . 404-6 attached at the branch point 410-1 to the memory signal controller 402 of the apparatus 400.

A second plurality of memory devices 404-7 . . . 404-N may be mounted to the apparatus as clam-shelled pairs. For example, the second plurality of memory devices 404-7 . . . 404-N may be mounted to the apparatus as a first clam-shell pair 406-7 and 406-8 and a second clam-shell pair 404-9 and 404-N. Each of the clam-shelled pairs of the first plurality of memory devices may be coupled to a second common command/address signal trace 406-2. The common signal trace 406-2 may communicatively couple the second plurality of memory devices 404-7 . . . 404-N to the memory signal controller 402 of the apparatus 400.

For example, the common command/address signal trace 406-2 may communicatively couple the second plurality of memory devices 404-7 . . . 404-N to the memory signal controller 402 of the apparatus 400 by daisy chaining the first clam-shelled pair of memory devices 406-7 and 406-8 and the second clam-shelled pair of memory devices 404-9 and 404-N to the memory signal controller 402. For example, rather than employing branch portions, the common command/address signal trace 406-2 may proceed from the memory signal controller 402 through and/or making contact with the vias of the first clam-shelled pair of memory devices 406-7 and 406-8 and the second clam-shelled pair of memory devices 404-9 and 404-N resulting in a daisy chained connection topology between the second plurality of memory devices 404-7 . . . 404-N and the memory signal controller 402.

In FIG. 4, the first plurality of memory devices 404-1 . . . 404-6 are illustrated as six memory devices arranged in three clam-shelled pairs communicatively coupled to the memory signal controller 402 in a star connection topology (e.g., a star 6 topology). However, examples consistent with the present disclosure are not so limited. Additionally, FIG. 4 illustrates the second plurality of memory devices 404-7 . . . 404-N as four memory devices arranged in two clam-shelled pairs coupled to the memory signal controller in a daisy-chained 4 connection topology. Again, examples consistent with the present disclosure are not so limited.

For example, some examples may include: a combination of a star 6 topology and a star 4 topology, each with respective corresponding signal traces, on a subchannel; a combination of a daisy-chained 6 topology and a daisy-chained 4 topology, each with respective corresponding signal traces, on a subchannel; a combination of star 4 topology, another star 4 topology, and a star 2 topology, each with respective corresponding signal traces, on a subchannel; a combination of daisy-chained 4 topology, another daisy-chained 4 topology, and a star 2 topology, each with respective corresponding signal traces, on a subchannel; a combination of five distinct star 2 topology arrangement, each with respective corresponding signal traces, on a sub-channel; etc. Again, there are non-limiting examples and additional examples are contemplated incorporating exclusively star topologies, exclusively daisy-chained topologies, and/or various combinations of star and daisy-chained topologies for operating various amounts of memory devices on a subchannel.

The apparatus 400 of FIG. 4 illustrated with the star 6 plus daisy chained 4 connection topology may be operated utilizing two command/address signal copies per sub-channel. For example, the memory signal controller 402 may generate and/or drive two copies of an incoming command/address signal: one sent along the first trunk portion 406-1 to the first plurality of memory devices 404-1 . . . 404-6 and one sent along the separate second trunk portion 406-2 to the second plurality of memory devices 404-7 . . . 404-N.

As described in the previous examples, the branch portions 408-1 . . . 408-3 of the same signaling net may be impedance matched to each other. Further, the trunk portion 406-1 may be impedance matched to the parallel combination of its connected branch portions 408-1 . . . 408-3. For example, the first common command/address signal trace 406-1 may have a first width, wherein each respective length-matched branch 408-1 . . . 408-3 has a second width, and wherein the first width is greater than the second width. Also, the first common command/address signal trace 406-1 have an inner layer with a first impedance, wherein each respective length-matched branch 408-1 . . . 408-3 has an inner layer with a second impedance, and wherein the second impedance is greater than the first impedance.

Table 1 illustrates a non-limiting example of relative performance characteristics found to be associated with the various examples described above. Table 1 illustrates various apparatus topologies and their respective speed limiting topology (e.g., the topology of the memory cells and their connections to a memory signal controller that take the longest duration of time to perform command/address signaling over). Additionally, Table 1 illustrates the respective amount of apparatus side command/address (CA) copies needed to reach the plurality of memory devices connected to the memory signal controller in the corresponding topology.

Further, Table 1 illustrates the respective amount of memory signal controller CA pins needed to signal the plurality of memory cells connected in the corresponding topology, bearing in mind that there are eight CA pins per subchannel for the two subchannels. Furthermore, Table 1 illustrates a relative signal integrity of a command/address signal driven to the plurality of memory devices via the corresponding topology. The signal integrity may be quantified utilizing interference, data eye consistency, and signal level measurements across each of the plurality of memory devices. However, the categories of "poor", "good", "great", and "excellent" may be relative designations of signal integrity designating the signal integrity associated with each corresponding topology relative to one another.

Table 1 also illustrates a relative rout-ability of the signal traces carrying the command/address signal to the plurality of memory devices from the memory signal controller utilizing the corresponding topology. The categories of "poor", "good", "great", and "excellent" may be relative designations of the complexity of routing the signal trace on the apparatus between the memory signal controller and the plurality of memory devices associated with each corresponding topology relative to one another.

DDR6 subchannel would be brought to ten. Thus, for the purposes of command/address signals the configurations described herein would achieve driving these ten memory device command/address inputs with as few driver pins as possible while maintaining an acceptable level of signal integrity. However, given alterations to the channel width of the DIMM system, alterations to the DQ/IO width of the memory devices, and/or alterations to the amount of subchannels (e.g., logical subdivisions) may translate to different quantities of memory devices being utilized on the DIMM system. Regardless, the various memory device/DIMM/signal trace configurations described herein may be scaled to accommodate various amounts of memory devices on a DIMM system while adhering to the configuration principles described herein.

Figure 5:
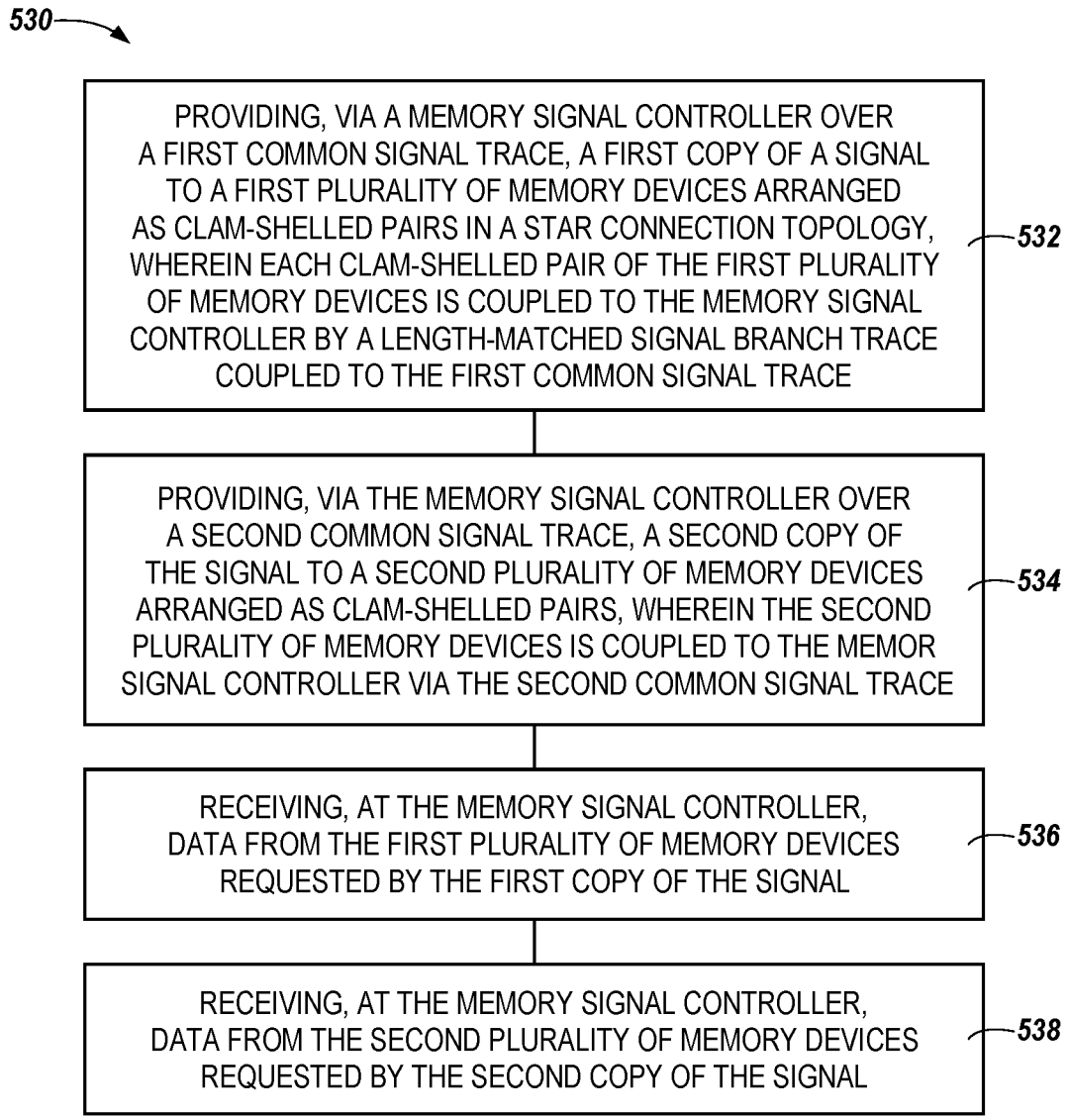
FIG. 5 is a diagram illustrating an example of a method 530 of operating a memory module in connection topologies consistent with a number of embodiments of the present disclosure.

FIG. 5 is a diagram illustrating an example of a method 530 of operating a memory module such as a dual in-line memory module (DIMM). The process illustrated by the method 530 may be performed to, for example, operate a memory module such as the apparatuses illustrated in FIG. 1A-1D, FIG. 2, FIG. 3, and/or FIG. 4. The described components and/or operation of the method 530 described with respect to FIG. 5 may include and/or be interchanged with the described components and/or operations in relation to FIGS. 1A-1D, FIG. 2, FIG. 3, and/or FIG. 4. In addition, the method 530 described with respect to FIG. 5 may be modified to achieve the particular components and/or operations in relation to FIGS. 1A-1D, FIG. 2, FIG. 3, and/or FIG. 4.

At 532, the method 530 may include providing a first copy of a signal to a first plurality of memory devices. The first copy of the signal may be a first copy of a command/address

TABLE 1

| TOPOLOGY OF APPARATUS | SPEED LIMITING TOPOLOGY | CA COPIES | SIGNAL CONTROLLER CA PIN COUNT | SIGNAL INTEGRITY | ROUTABILITY |
|---|---|---|---|---|---|
| DAISY 10 | DAISY 10 | 1 | 8 × 2 = 16 | POOR | EXCELLENT |
| STAR 6 + STAR 4 | STAR 6 | 2 | 16 × 2 = 32 | GOOD | FAIR |
| DAISY 6 + DAISY 4 | DAISY 6 | 2 | 16 × 2 = 32 | FAIR | GREAT |
| 2 × STAR 4 + STAR 2 | STAR 4 | 3 | 24 × 2 = 48 | GREAT | GOOD |
| 2 × DAISY 4 + STAR 2 | DAISY 4 | 3 | 24 × 2 = 48 | GREAT | GOOD |
| 5 × STAR 2 | STAR 2 | 5 | 40 × 2 = 80 | EXCELLENT | POOR |

Table 1 illustrates the relative performance characteristics of various configurations of ten memory devices. The examples described herein are not limited to the described configurations in the context of coupling to ten memory devices. For example, the quantity of clam-shelled pairs of memory devices mounted to a DIMM may depend on a channel width associated with the DIMM system. For example, a DIMM implementing a DDR6 protocol may have a full channel width of 80 bits wide which includes ECC bits. In such examples, the DDR6 protocol may logically divide the 80 bits wide channel into four subchannels that are each 20 bits wide. In such examples, each sub-channel bus width may be comprised of five×four memory devices (e.g., DRAMs) to accommodate memory devices with a corresponding DQ IO width. To provide additional signaling capacity while minimizing the impact to signal integrity, each memory device may be clam-shelled on to a bottom side of the DIMM printed circuit board (PCB) as well. The memory device on the top of the PCB may belong to a rank 0 and the memory device on the bottom of the PCB may belong to rank 1 for the purposes of signaling among the subchannels. As such, the component count per signal provided by the memory signal controller. The memory signal controller may include an RCD formed on a DIMM to be coupled to and/or communicate command/address signals with the first plurality of memory devices. In some examples, the memory signal controller may include a data buffer on the DIMM with additional components and functionality to perform combined data buffer and RCD operations to be coupled to and/or communicate command/address signals with the first plurality of memory devices.

For example, the memory signal controller may receive a command/address signal and/or instructions to generate a command address signal from a host. The memory signal controller may generate a first copy of the command/address signal and drive the copy to the first plurality of memory devices over a first common command/address signal trace.

The first plurality of memory devices may be arranged by mounting to a dual in-line memory module (DIMM). The first plurality of memory devices may be arranged as clam-shelled pairs. The clam-shelled pairs of memory devices may be formed in a star topology.

A common command/address signal trunk trace may span from the memory signal controller to a branch point. The branch point may be located at an end of a common command/address signal trunk trace opposite an opposing end coupled to the memory signal controller. The clam-shelled pairs of memory devices may be arranged in a pattern configured to couple to the memory signal controller through the branch point via respective command/address signal branch traces. For example, each of the clam-shelled pairs of the first plurality of memory devices may be coupled to the memory signal controller by a distinct command/address signal branch trace coupled to the common trunk trace through the branch point.

The command/address signal branch traces may be command/address signal branch traces coupled to a corresponding clam-shelled pair of memory devices at a first end and be coupled to a first common command/address signal trunk trace at an opposing second end. The common command/address signal trunk trace may span from a branch point, where it connects to the plurality of command/address signal branch traces of the plurality of clam-shelled pairs of the first plurality of memory devices, to a coupling point where it is coupled with the memory signal controller.

The plurality of command/address signal branch traces of the plurality of clam-shelled pairs may be matched (e.g., length, impedance, etc.). For example, each of the plurality of command/address signal branch traces may be length matched to each other, each of the plurality of command/address signal branch traces impedance matched to each other, the parallel combination of the plurality of command/address branch traces may be impedance matched to the common command/address signal trunk trace. For example, the plurality of command/address signal branch traces of the plurality of clam-shelled pairs may be formed such that they have the same length and/or impedance value In further examples, each of the plurality of command/address signal branch traces may have an impedance that is individually higher than an impedance of the common command/address signal trunk trace, but the combination of the plurality of command/address signal traces in parallel may be matched with the impedance value of the common command/address signal trunk trace.

Depending on where the command/address signal trunk trace branch point is formed, a portion of the plurality of clam-shelled pairs of memory devices may be located closer to the branch point than others. However, regardless of the distance from the branch point, the entire plurality of clam-shelled pairs of memory devices on a same physical signaling net may have a same length (e.g., be length matched).

The length matched command/address signal branch trace for a clam-shelled pair of memory devices relatively more distal to the branch point of the first common command/address signal trunk trace may be formed in a direct and/or non-meandering path from the first common command/address signal trunk trace to the claim-shelled pair. The length of this non-meandering command/address signal branch trace maybe a relatively greatest length required to reach a claim-shelled pair when the clam-shelled pair is a furthest clam-shelled pair from the branch point.

However, in order to achieve length matching, the other command/address signal branch traces extending to clam-shelled pairs of a plurality of clam-shelled pairs of memory devices may be a same length despite being closer to the branch point. As such, the other command/address signal branch traces may include excess length with respect to the actual length required to reach the clam-shelled pairs located relatively closer to the branch point. As such, in some examples, the length matched command/address signal branch trace for a clam-shelled pair of memory devices that is relatively more proximate to the branch point of the first common command/address signal trunk trace may include be formed along a meandering path in order to route the excess length of branch trace required to length match more distally located clam-shelled pairs.

In addition to the length matching among the command/address signal branch traces of the first plurality of clam-shelled pairs, the impedance of the command/address signal branch traces coupled to the first common command/address signal trunk trace may be matched to the impedance of each other and/or matched as a parallel combination to the impedance of the first common command/address signal trunk trace. For example, the impedance of all length-matched command/address signal branch traces coupled to the first common command/address signal trunk trace may be matched to an impedance of the first common command/address signal trunk trace. For example, the first common command/address signal trunk trace may be formed to have a first width and each respective length-matched command/address signal branch trace may be formed to have a second width, wherein the first width is greater than the second width. As a result, the branch portions may have higher impedances than the trunk portion, but may, as a parallel combination, be matched to the lower impedance of the trunk portion. Also, matching the impedance of all length-matched command/address signal branch traces coupled to the first common command/address signal trunk trace to an impedance of the first common command/address signal trunk trace may include forming the first common command/address signal trunk to have an inner layer with a first impedance (e.g., through material selection, processing methods, material layering, etc.), and forming each respective length-matched command/address signal branch to have an inner layer with a second impedance (e.g., through material selection, processing methods, material layering, etc.), wherein the second impedance is greater than the first impedance. As a result, the branch portions may have higher impedances than the trunk portion, but may, as a parallel combination, be matched to the lower impedance of the trunk portion.

Again, the memory signal controller may provide, over the first common command/address signal trace, a first copy of a command/address signal to the first plurality of memory devices arranged as clam-shelled pairs in a start connection topology. Again, each clam-shelled pair of the first plurality of memory devices may be coupled to the memory signal controller by a matched (e.g., length, impedances, etc.) command/address signal branch trace coupled to the first common command/address signal trace.

Again, the length-matched branch signal traces on a same signaling net may be routed along a meandering path and/or a non-meandering path based on their proximity to the branch point of the common trace. As such, providing the first copy of the command/address signal to the first plurality of memory devices may include driving the first copy of the command/address signal to a clam-shelled pair proximate to a branch point from the first common command/address signal trace along a meandering length-matched command/address signal branch trace. Further, providing the first copy of the command/address signal to the first plurality of memory devices may include driving the first copy of the command/address signal to a clam-shelled pair distal to a branch point from the first common/command address signal trace along a non-meandering length-matched command/address branch trace.

Again, the length-matched branch signal traces on a same signaling net may be impedance matched to each other and/or impedance matched as a parallel combination to a trunk portion. As such, providing the first copy of the command/address signal to the first plurality of memory devices may include driving the first copy of the command/address signal to each of the first plurality of memory devices along their respective length-matched command/address signal branch traces coupled to the first common command/address signal trace, wherein a parallel combination of all the length-matched command/address signal branch traces connected to the first common command/address signal trace has an impedance value matching the impedance value of the first common command/address signal trace.

At 534, the method 530 may include providing, via the memory signal controller over a second common command/address signal trace, a second copy of the command/address signal to a second plurality of memory devices arranged as clam-shelled pairs, wherein the second plurality of memory devices is coupled to the memory signal controller via the second common command/address signal trace. The second plurality of memory devices may be arranged by mounting to the same DIMM where the first plurality of memory devices is mounted. The second plurality of memory devices may be arranged as clam-shelled pairs of memory devices.

In some examples, the second plurality of memory devices may be arranged in a star topology. In some examples, the second plurality of memory devices may be arranged in a daisy-chained topology (e.g., a topology in which the memory devices are connected together in a sequence, ring, or series). The amount of clam-shelled pairs of memory devices formed in the second plurality may be an amount that is complementary to the amount formed in the first plurality such that the first plurality and the second plurality arrive at a targeted amount of memory devices being operated by the memory signal controller on a specific subchannel corresponding to the two pluralities.

The second plurality of memory devices may be coupled to the memory signal controller via a second command/address signal trunk trace, which may be separate and/or electrically isolated from the first, that is connected at a first end to the memory signal controller. The second plurality of memory devices may be connected to the memory signal controller via the second command/address signal trunk trace. In examples where the second plurality of memory devices is arranged in a daisy-chained topology, each of the second plurality of memory devices may be directly connected to the second command/address signal trunk trace (e.g., through contact between their respective conductive vias and the trace). Conversely, in examples where the second plurality of memory devices is arranged in a star topology, each of the clam-shelled pairs of the second plurality of memory devices may be directly connected to a respective length and/or impedance matched command/address signal branch trace which spans between the corresponding memory devices and the second command/address signal trunk trace.

As described above, the memory signal controller may be configured to create, responsive to receiving a command/address signal from a host, a first copy of the command/address signal to be driven to the first plurality of memory devices over the first common command/address signal trunk trace. The memory signal controller may drive the first copy of the command/address signal to the first plurality of memory devices over the first common command/address signal trunk trace within and/or through their respective command/address signal branch traces.

Additionally, the memory signal controller may be configured to create, responsive to receiving that same command/address signal from the host, a second copy of the command/address signal to be driven to the second plurality of memory devices over the second common command/address signal trunk trace. The memory signal controller may drive the second copy of the command/address signal to the second plurality of memory devices over the first common command/address signal trunk trace directly connected to the second plurality of memory devices. In examples where the second plurality of memory devices are arranged in a star topology, the memory signal controller may drive the second copy of the command/address signal to the first plurality of memory devices over the first common command/address signal trunk trace within and/or through their respective command/address signal branch traces.

The memory signal controller may be configured to communicate the first copy of the signal to the first plurality of memory devices and the second copy of the signal to the second plurality of memory devices over a same subchannel. For example, the first plurality of memory devices and the second plurality of memory devices may be assigned to a same communication subchannel of the memory signal controller. The memory signal controller may be configured to create and/or drive additional copies of the commands to other memory devices assigned to other communication subchannels of the memory signal controller.

At 536, the method 530 may include receiving, at the memory signal controller, data from the first plurality of memory devices. The data may be data retrieved from the first plurality of memory devices. The data may be data that the first copy of the command/address signal specified for retrieval from the first plurality of memory devices. The first plurality of memory devices may be coupled to the memory signal controller via a DQ signal net which may be separate from the command/address signal net. The data retrieved from the first plurality of memory devices may be transmitted back to the memory signal controller via a DQ signal net trace.

At 538, the method 530 may include receiving, at the memory signal controller, data from the second plurality of memory devices. The data may be data retrieved from the second plurality of memory devices. The data may be data that the second copy of the command/address signal specified for retrieval from the second plurality of memory devices. The second plurality of memory devices may be coupled to the memory signal controller via a DQ signal net which may be separate from the command/address signal net. The data retrieved from the second plurality of memory devices may be transmitted back to the memory signal controller via a DQ signal net trace.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a first plurality of clam-shell paired memory devices arranged in a star-connection topology, each clam-shelled pair of the first plurality of memory devices being coupled by a respective matched branch to a first common command address signal trace; and
a second plurality of memory devices coupled to a second common command address signal trace.

2. The apparatus of claim 1, wherein the second plurality of memory devices are arranged in clam-shelled pairs arranged in a star connection topology, each clam-shelled pair of the second plurality of memory devices coupled by a respective matched branch to the second common command address signal trace.

3. The apparatus of claim 1, wherein the second plurality of memory devices are arranged in a daisy-chained connection topology.

4. The apparatus of claim 1, wherein the first plurality of clam-shell paired memory devices includes six memory devices arranged in three clam-shelled pairs.

5. The apparatus of claim 4, wherein the second plurality of clam-shelled paired memory devices includes four memory devices arranged in two claim-shelled pairs.

6. The apparatus of claim 1, wherein the first common command/address signal trace has a first width, wherein each respective length-matched branch has a second width, and wherein the first width is greater than the second width.

7. The apparatus of claim 1, wherein the first common command/address signal trace has an inner layer with a first impedance, wherein each respective length-matched branch has an inner layer with a second impedance, and wherein the second impedance is greater than the first impedance.

8. The apparatus of claim 1, wherein the first plurality of clam-shell paired memory devices comprise clam-shell paired dynamic random access memory (DRAM) devices.

9. An apparatus, comprising:
a memory signal controller configured to drive copies of command/address signals, received from a host, to electrically coupled memory devices;
a first plurality of memory devices arranged as clam-shelled pairs in a star connection topology, wherein each of the claim-shelled pairs is coupled to the memory signal controller by a first common command/address signal trace; and
a second plurality of memory devices coupled to the memory signal controller by a second common command/address signal trace.

10. The apparatus of claim 9, wherein the first common command/address signal trace comprises a trunk trace coupled to the memory signal controller and spanning to a branch point.

11. The apparatus of claim 10, wherein each clam-shelled pair of the first plurality of memory devices are coupled to the trunk trace by a respective branch trace spanning from a via between a corresponding clam-shelled memory device pair to the branch point.

12. The apparatus of claim 11, wherein each branch trace between each clam-shelled pair of the first plurality of memory devices and the branch point are a same length.

13. The apparatus of claim 12, wherein a branch trace of a first clam-shelled pair of the first plurality of memory devices located proximate to the memory signal controller is routed in a serpentine path between the branch point and the first clam-shelled pair, and wherein a branch trace of a second clam-shelled pair of the first plurality of memory devices located distal from the memory signal controller is routed in a direct path between the branch point and the second clam-shelled pair.

14. The apparatus of claim 11, wherein all branch traces coupling the first plurality of memory devices to the branch point are impedance matched to one another.

15. The apparatus of claim 9, wherein the memory signal controller comprises a register clock driver (RCD) configured to transmit a first copy of a command/address signal to the first plurality of memory devices by the first common command/address signal trace.

16. The apparatus of claim 9, wherein the memory signal controller comprises a data buffer configured to:
transmit a first copy of a command/address signal to the first plurality of memory devices by the first common command/address signal trace; and
to communicate data to be read or written between the first plurality of memory devices and the host.

17. The apparatus of claim 9, wherein the first plurality of memory devices and the second plurality of memory devices are coupled to a first subchannel of the memory signal controller but receive separate copies of a command/address signal sent to the first subchannel from the host.

18. A method, comprising:
providing, via a memory signal controller over a first common signal trace, a first copy of a signal to a first plurality of memory devices arranged as clam-shelled pairs in a star connection topology, wherein each clam-shelled pair of the first plurality of memory devices is coupled to the memory signal controller by a length-matched signal branch trace coupled to the first common signal trace;
providing, via the memory signal controller over a second common signal trace, a second copy of the signal to a second plurality of memory devices arranged as clam-shelled pairs, wherein the second plurality of memory devices is coupled to the memory signal controller via the second common signal trace;
receiving, at the memory signal controller, data from the first plurality of memory devices requested by the first copy of the signal; and
receiving, at the memory signal controller, data from the second plurality of memory devices requested by the second copy of the signal.

19. The method of claim 18, wherein the signal is a command/address signal, and wherein the method comprises:
driving the first copy of the command/address signal to a clam-shelled pair proximate to a branch point from the first common command/address signal trace along a meandering length-matched command/address signal branch trace; and driving the first copy of the command/address signal to a clam-shelled pair distal to a branch point from the first common/command address signal trace along a non-meandering length-matched command/address branch trace.

20. The method of claim 18, comprising driving the first copy of the command/address signal to each of the first plurality of memory devices along their respective length-matched command/address signal branch traces coupled to the first common command/address signal trace, wherein a parallel combination of all the length-matched command/address signal branch traces connected to the first common command/address signal trace has an impedance value matching the impedance value of the first common command/address signal trace.

* * * * *